United States Patent [19]

Heath et al.

[11] 4,083,708

[45] Apr. 11, 1978

[54] FORMING A GLASS ON A SUBSTRATE

[75] Inventors: Carl E. Heath, Neuilly sur Seine, France; Daniel Grafstein, Convent Station; John V. Milewski, Bridgewater, both of N.J.

[73] Assignee: Exxon Research & Engineering Co., Linden, N.J.

[21] Appl. No.: 815,142

[22] Filed: Jul. 13, 1977

Related U.S. Application Data

[63] Continuation-in-part of Ser. No. 723,605, Sep. 15, 1976, abandoned.

[51] Int. Cl.[2] ...................... C03C 19/00; C03C 25/02; C03C 17/00

[52] U.S. Cl. ....................................... 65/23; 65/30 R; 65/32; 65/60 D; 65/3 A; 65/DIG. 16; 427/248 R; 427/248 C; 427/255; 427/34

[58] Field of Search ................ 65/DIG. 16, 60 D, 32, 65/3 A, 23, 30 R; 427/248 C, 248 R, 34, 255, 112

[56] References Cited

U.S. PATENT DOCUMENTS

| | | | |
|---|---|---|---|
| 2,268,589 | 1/1942 | Heany | 65/DIG. 16 |
| 2,272,342 | 2/1942 | Hyde | 65/DIG. 16 |
| 2,901,649 | 8/1959 | Knight | 427/248 R |
| 2,967,115 | 1/1961 | Herrick | 427/248 C |
| 3,116,137 | 12/1963 | Vasilus et al. | 65/23 X |
| 3,129,315 | 4/1964 | Radke et al. | 427/248 R |
| 3,275,408 | 9/1966 | Winterburn | 65/60 D |
| 3,331,716 | 7/1967 | Bloem et al. | 427/248 C |
| 3,764,397 | 10/1973 | Bornstein et al. | 427/248 R |
| 3,865,647 | 2/1975 | Reuschel | 65/DIG. 16 |
| 4,002,512 | 1/1977 | Lim | 65/3 A X |

*Primary Examiner*—S. Leon Bashore
*Assistant Examiner*—Frank W. Miga
*Attorney, Agent, or Firm*—Joseph J. Dvorak

[57] ABSTRACT

Adherent layers of glass are deposited on a preform or substrate via the controlled oxidation of a glass precursor, such as silicon monoxide, in the vapor state, thereby providing unusual shaped composite articles having a glass coating on the substrate. A preform or substrate such as carbon can subsequently be oxidized, thereby providing a glass microcapillary of exceedingly uniform dimensions.

11 Claims, 5 Drawing Figures

FORMING A GLASS ON A SUBSTRATE

CROSS REFERENCE TO RELATED APPLICATION

This application is a continuation-in-part of U.S. application Ser. No. 723,605, filed Sept. 15, 1976 now abandoned.

BACKGROUND OF THE INVENTION

This invention relates to a method of producing shaped glass articles including glass composited articles by chemical vapor desposition. The invention is especially concerned with a method of preparing silica-type glass bodies of exceptionally high purity under controlled conditions.

Typical processes for preparing high silica glasses include fusion of quartz and acid leaching of phase separated borosilicate glasses. The resultant high silica containing material generally is heated at elevated temperatures and consolidated prior to shaping.

It is also known to form shaped silica articles by flame hydrolysis. Briefly, in this technique a stream of gas entraining a compound of silicon is introduced into the flame of a combustible gas. The compound of silicon is hydrolyzed to form amorphous silica which is desposited on a mandrel.

Preparation of glass by the fusion and acid leaching techniques outlined above is often costly and does not lend itself well to forming composite glass articles, particularly those in which a silica is deposited on the surface of a substrate in a very thin adherent layer. The flame hydrolysis technique lends itself to deposition of silica on a mandrel. However, the number of suitable volatile silica compounds that can be used by the flame hydrolysis technique is quite limited and, more importantly, deposition of uniform controlled amounts of fused silica-type glass by this technique is quite difficult, expecially on very thin, small and delicate mandrels of intricate shapes.

SUMMARY OF THE INVENTION

The present invention is predicated on the discovery that a glass can be deposited on a suitable mandrel or preform by the controlled oxidation of the glass precursor or former in the vapor state. The present invention is further based on the discovery that if a substrate or mandrel, such as a graphite, substrate or mandrel, is used and the glass precursor is silicon monoxide, an adherent layer of high purity silica glass can be deposited onto the substrate, thereby providing novel composite materials.

Additionally, it has been discovered that the present process is suitable to the formation of microcapillaries having exceedingly uniform dimensions of unusually thin wall thicknesses.

Accordingly, in one embodiment of the present invention, there is provided a method of forming a shaped silica glass article which comprises placing a mandrel or preform in a reaction chamber while passing a stream of silicon monoxide therethrough and simultaneously oxidizing the silicon monoxide therein by contact with a controlled oxidizing atmosphere at temperatures generally in the range of about 1300° to about 1700° C and preferably about 1400° C, whereby the silicon monoxide is oxidized to silicon dioxide and is deposited in the form of glass on the mandrel or preform. Preferably, the oxidizing atmosphere maintained in the reaction chamber contains $CO_2$ as the oxidizing gas. Indeed, it is particularly preferred that the oxidizing gas will be a mixture of CO, $CO_2$, hydrogen, nitrogen and methane.

In the practice of the present invention, it is particularly preferred to continuously add carbon dioxide to the gas whenever the $CO_2$/CO ratio falls below about 0.015. Indeed, it is particularly preferred to maintain the $CO_2$/CO ratio in the reaction chamber in the range of about 0.015 to about 0.050, 0.038 being preferred.

BRIEF DESCRIPTION OF THE DRAWINGS

FIG. 2 is a microphotograph having a magnification factor of 1000 of a silica glass coated carbon fiber of the present invention.

FIG. 3 is a microphotograph illustrating th bond between th glass and carbon fiber of FIG. 2.

FIG. 4 is a microphotograph having a magnification factor of 1000 of a glass microcapillary of this invention.

FIG. 5 is a microphotograph having a magnification factor of 50 of a glass composite of this invention.

DETAILED DESCRIPTION OF THE INVENTION

Figure 1:
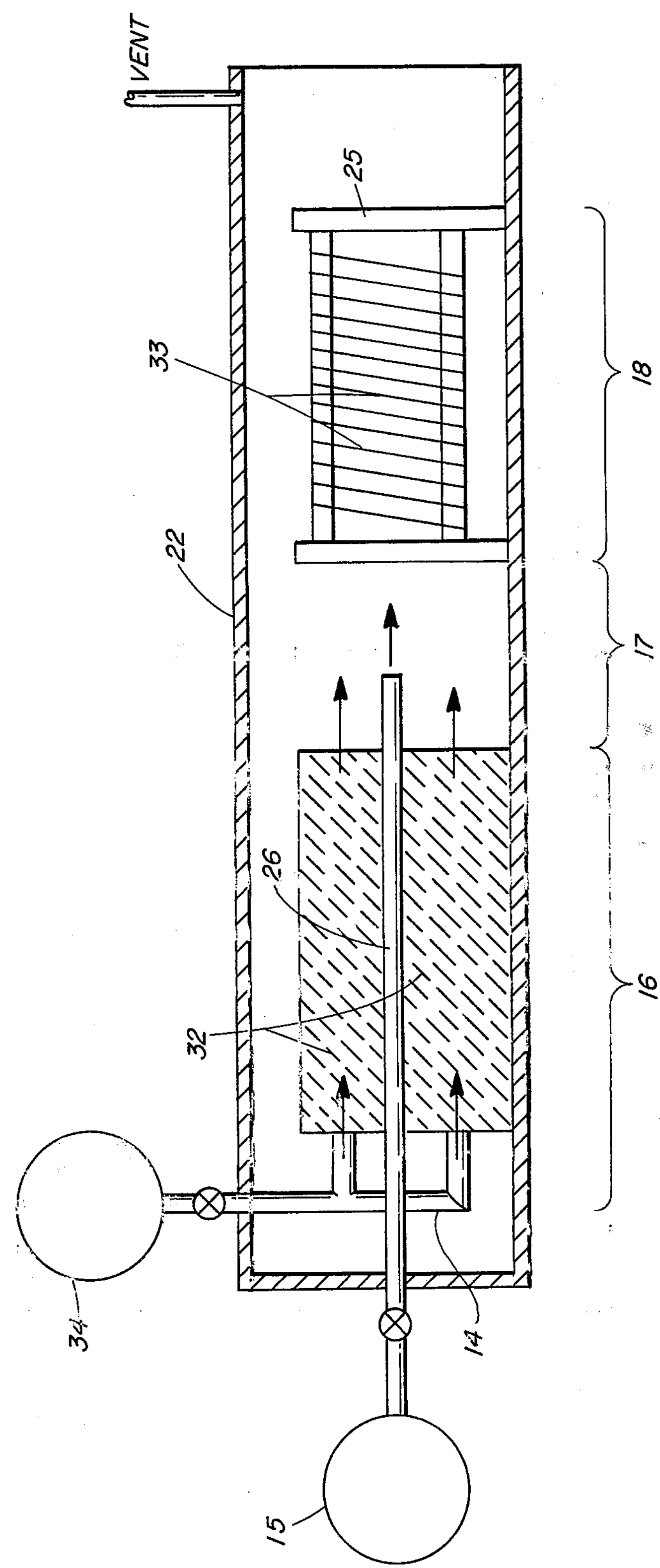
FIG. 1 is a schematic illustration of the method of the present invention.

By way of illustration only, a process embodying the present invention will be described hereinafter in greater detail and with reference to the schematic illustration of FIG. 1 of the drawings.

In accordance with the practice of the present invention, shaped glass articles, particularly high purity silica glass articles, are prepared by depositing a glass material on a suitable mandrel or preform from the vapor state via oxidation of a glass precursor at a controlled rate. Thus, as is shown in FIG. 1, a source 32 of glass precursor is provided; in the illustration of FIG. 1, the glass precursor is silicon monoxide; the glass formed is silicon dioxide; and the source 32 of the silicon monoxide is a reducible silica containing solid refractory brick.

It will be appreciated that other glass-forming materials such as boron and germanium could also be used, in which event oxidizable lower oxides of germanium and boron can be employed.

In any event, as shown in FIG. 1, source 32 is placed in a region or zone 16 in furnace 22 wherein the glass precursor, silicon monoxide, is generated. Typically, the silicon monoxide will be generated by reacting a silica-containing refractory material with hydrogen at temperatures in the range of from about 1300° to 1700° C and pressures in the range of about 0.5 to 2.0 atmospheres, and preferably 1.0 atmosphere.

A particularly suitable silicon refractory material is K30 Brick sold by Babcock and Wilcox, Augusta, Ga. Advantageously, the silica refractory will have sufficient porosity to permit diffusion of reducing gases through the solid, thereby facilitating the reduction of silica in the solid to silicon monoxide vapor.

As can be seen in FIG. 1, the glass precursor is fed to a mixing and oxidizing zone 17 where it is mixed with an oxidizing gas. Thereafter the entire effluent from zone 17 is introduced into a deposition zone 18.

In the FIG. 1 embodiment, deposition zone 18 is within furnace 22 also. It should be appreciated, however, that, if so desired, the glass precursor does not have to be generated and oxidized in the deposition furnace.

Returning to FIG. 1, a harp 25 is provided for supporting a preform or mandrel on which glass will be deposited in deposition zone 18. In the embodiment as shown in FIG. 1, fibers 33, such as boron or carbon fibers, are suspended from the harp 25 for coating with substantially pure silicon dioxide glass. Other materials can be used as the mandrel or substrate also. For example, silicon carbide mandrels may be employed. Additionally, the mandrel need not be restricted to a fiber geometry but may even have a more intricate shape. Indeed, the substrate or mandrel may be of any material which is chemically and thermally stable under the glass deposition temperatures. Typically the mandrel will be selected from boron, amorphous and crystalline forms of carbon, refractory metals such as tungsten and molybdenum, silicon carbide and the carbides and nitrides of refractory metals.

In any event, communicating with furnace 22 and the reducible source 32 of the glass precursor, silicon monoxide, via line 14 is a source of reducing gas 33. Also communicating with furnace 22 via line 12 is a source of oxidant, such as the carbon dioxide source 15. This $CO_2$ source 15 communicates with the furnace 22 via tube 26.

Typically, the reducing gas introduced into furnace 22 via line 14 is a mixture of hydrogen, nitrogen and methane; and the oxidizing gas introduced from source 15 via line 26 is a mixture of $CO_2$ and CO.

The hydrogen containing reducing gas is introduced into the pores of the glass precursor source 32 via line 14 at temperatures of from about 1300° to 1700° C at pressures of from about 0.5 to 2.0 atmospheres. Preferably zone 16 is preheated to 1400° and 1500° C and the reducing gas is introduced therein at 1 atmosphere pressure. The oxidizing gas is delivered to the furnace 22 via line 26 directly into mixing and oxidizing zone 17.

Advantageously, the carbon dioxide-oxidizing gas will be preheated to a temperature generally in the range of about 1300° to 1700° C and preferably in the range of 1400° to 1500° C. As will be readily appreciated, the preheating is accomplished by any suitable heating device; however, having line 26 pass through zone 16 of furnace 22 is most advantageous.

As will be readily appreciated, the carbon dioxide containing gas must be sufficiently rich in carbon dioxide to be oxidizing with respect to silicon monoxide under glass forming conditions, but not too rich to oxidize the carbon or graphite mandrel. Obviously, the oxidizing power of the carbon dioxide gas is effectively limited by equilibria between unreacted oxidizing gases and the reduced gases in the zone where the oxidation takes place.

It is particularly important, then, to assure that the gas being fed to the deposition zone 18 does not have too high an oxidizing potential. In the present invention, methane is introduced into the mixing and oxidizing zone 17 as an oxidation moderator, thereby preventing the vapors being introduced into the deposition zone 17 from having an excessively high oxidation potential. Using the device of FIG. 1, it is convenient to introduce the methane with the hydrogen reducing gas via line 14. Consequently, the extent of oxidation of the silicon monoxide to a glass will be a function, inter alia, of the gas equilibria. Thus, when carbon dioxide is used as the oxidizing agent there will be specific carbon dioxide/-carbon monoxide ratio which is in equilibrium with the silicon monoxide and silicon dioxide in the furnace 22. Therefore, when equilibrium has been reached in the furnace 22, whether the gas in furnace 22 remains oxidizing with respect to silicon monoxide can be determined by reference to the composition of the gases at the specified temperatures in the furnace.

Advantageously, the entire furnace 22 including the preforms or mandrels, such as fibers 33, is preheated to a temperature in the range of about 1300° to 1700° C and preferably in the range of 1400° to 1500° C while introducing the reducing gas. At that time, the silicon monoxide vapors are generated in the furnace 22 and flow to mixing zone 17. After generation of the silicon monoxide containing gas, the oxidizing gas is introduced. Thus, the $CO_2$ oxidizing gas is introduced into zone 17 via line 26 at a pressure of about 0.5 to 2.0 atmospheres. The $CO_2$ containing gas will be preheated as it passes through zone 16. Oxidation of silicon monoxide will take place substantially instantaneously in the vapor state in zone 17. As a consequence thereof, a saturated vapor of minute droplets of $SiO_2$ glass is suspended in the gas stream which subsequently will deposit as $SiO_2$ glass on the preform or mandrel 17. Some of the $CO_2$ will have been reduced in zone 17 to carbon monoxide. Nonetheless, the $CO_2$ containing gas still may be of sufficient oxidizing potential. Generally, however, the flow of oxidizing and reducing gases is controlled such that the oxidizing gas in zone 17 has a ratio of $CO_2$/CO of about 0.015:1 to 0.05:1 with 0.03:1 to 0.04:1 being preferred, and a ratio of methane/hydrogen of about 0.01:1 to 0.2:1, with a ratio of 0.04:1 to 0.08:1 being preferred. The ratio of hydrogen/nitrogen should be maintained between 20:1 to 3:1 with 6:1 being preferred. As indicated, these ratios relate to these constituents in zone 17 of furnace 22.

Additional amounts of silicon monoxide can be generated in the furnace 22 by increasing the temperature in the generation zone 16, depending on the extent of glass that is to be deposited on the mandrel. Additional introduction of SiO, of course, will require additional introduction of oxidizing gas. After sufficient silica is deposited on the mandrel 17, the composite material can be removed. Alternatively, introduction of silicon monoxide and carbon dioxide can be stopped and the temperature of the furnace lowered to a temperature in the range of 800° to 1200° C and air introduced to burn out the carbon or graphite mandrel. Under these conditions, the carbon is completely oxidized to carbon monoxide and a pure silicon microcapillary remains.

The invention is further illustrated by the following examples:

EXAMPLE 1

Figures 2, 3, 4, 5:
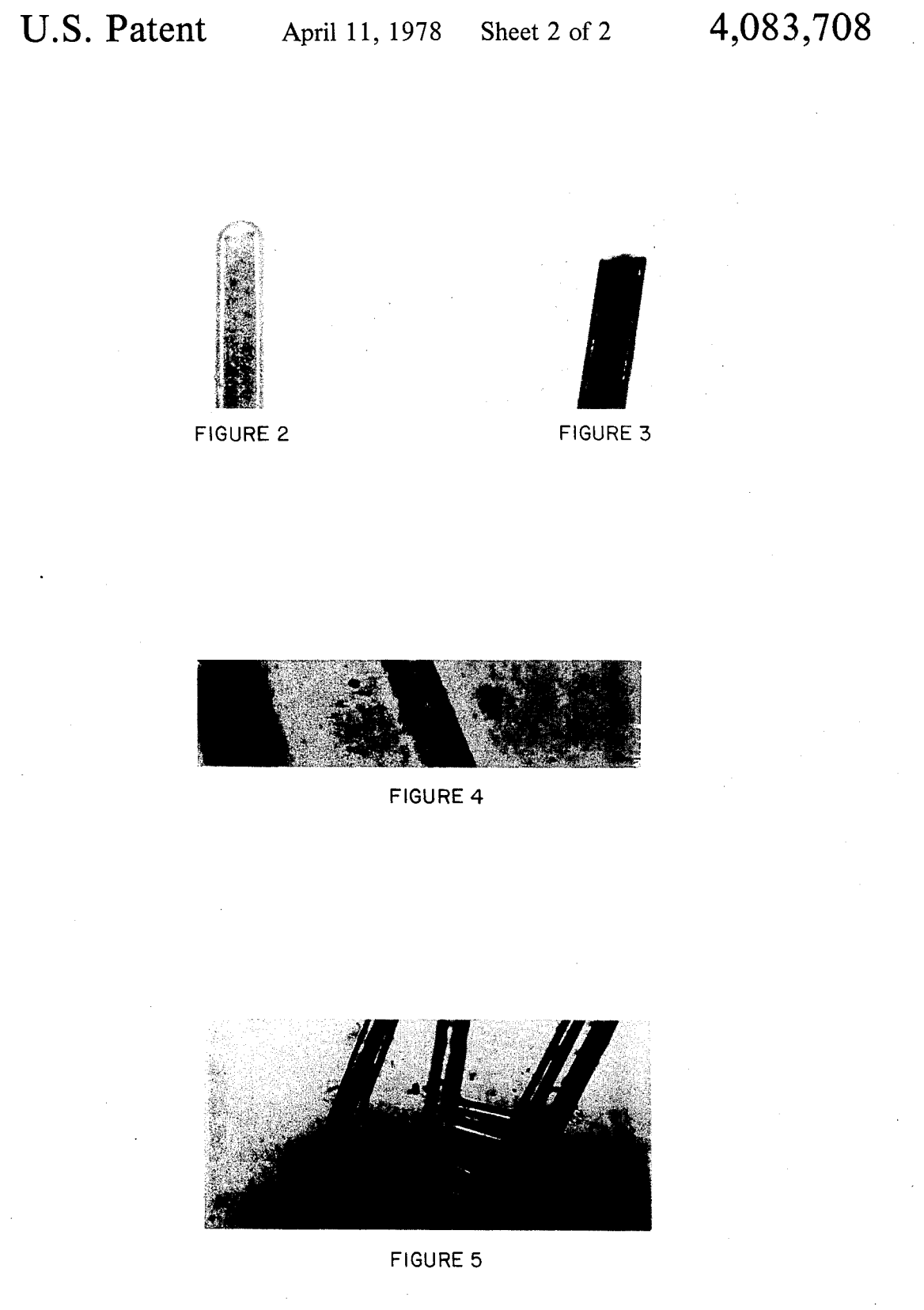

Fibers having a diameter of 6.0 microns and a length of 2.0 inches were mounted on a harp 25 and placed within an electric heated furnace 22. In zone 16 of furnace 22 silica-rich bricks were placed. The temperature of the furnace was raised to 1400° C. Reducing gas was fed through line 14 at the following rates: $H_2$, 11,000 cc/min; $N_2$, 1600 cc/min; and $CH_4$, 750 cc/min. Carbon dioxide and carbon monoxide were introduced into zone 17 via line 26 at the following rates: $CO_2$, 60 cc/min; CO, 1600 cc/min. The reaction was allowed to proceed until a silica coating of 0.6 microns thickness was built up on the fiber. This took about 30–40 min. Thereafter, the fiber was removed from the furnace and allowed to cool to ambient temperature and the composite material was physically inspected. A microphotograph of the article is shown in FIG. 2. As can be seen in the microphotograph (magnification factor of 1000) of FIG. 3, when the end of the fiber coated with glass in accordance with the present technique was broken, both the fiber and the glass failed at the same point. This concurrent failure of both materials indicates a very strong bond between the glass and fiber.

EXAMPLE 2

A fiber prepared in accordance with Example 1 was exposed to air in furnace 22 at 800° C for 1 hour. As can be seen in the microphotograph of FIG. 4, a uniform glass microcapillary formed. As also can be seen in the microphotograph, no side burning indicates an entirely pore-free coating was achieved.

EXAMPLES 3-6

Following the procedure of Examples 1 and 2, numerous microcapillaries were prepared by depositing a silicon dioxide glass on carbon fibers having varying diameters and thereafter heating the glass coated fibers at a temperature of about 800° C in air so as to burn out the fiber mandrel, leaving the microcapillary. The outer diameter (OD) of the resultant tubes and the wall thickness (W) in microns are given in Table I below. As can be seen, measurements made at both the top and bottom of the capillaries show them to be exceedingly uniform.

TABLE I

| | O.D. $\mu$ | | W, $\mu$ | |
|---|---|---|---|---|
| Ex. No. | Top | Bottom | Top | Bottom |
| 3 | 68.2 | 70.9 | 1.0 | 1.0 |
| 4 | 71.1 | 71.6 | 1.0 | 1.3 |
| 5 | 71.8 | 72.4 | 1.1 | 1.1 |
| 6 | 74.1 | 74.7 | 1.9 | 1.7 |

EXAMPLE 7

Following the procedure of Example 1 up to 20 weight percent of silica was deposited on graphite fibers. As a result of these heavy coatings, considerable webbing took place between the composite glass coated graphite fibers, as can be seen in the microphotograph of FIG. 5

As will be readily appreciated, such material has particular utility as a reinforcing material for various plastic materials. Indeed, as will be readily appreciated, the silicon dioxide coatings afford better bonding surfaces for an organic matrix than do graphite fibers by themselves.

EXAMPLE 8

In this example, the procedure of Example 1 was generally followed and up to 20 weight percent of silica was deposited on silicon carbide whiskers with the result that extensive webbing took place. Indeed, the glass webs or glass truss work connecting the glass coated silicon carbide whiskers appeared to be greater even than that shown for the graphite fibers of Example 4.

While the present invention has been described with specific reference to the aforementioned composite glass materials for reinforcing plastic matrices and for the formation of high purity thin-walled silicon glass microcapillaries, it will be readily appreciated that other materials and shaped articles can be formed in accordance with the practice of the present invention.

What is claimed is:

1. A method for forming a composite glass article having a glass exterior coating on a shaped substrate comprising: placing a shaped substrate in a reaction chamber, said substrate being selected from materials chemically and thermally stable under glass deposition temperatures; introducing a stream of a glass precursor consisting essentially of generated silicon monoxide and being capable of being oxidized to a glass; simultaneously introducing an oxidizing gas into the reaction chamber whereby the glass precursor is oxidized to a glass and deposited on said substrate.

2. The method of claim 1 wherein the substrate is selected from carbon, boron, silicon carbide, refractory metals, and carbides and nitrides of refractory metals.

3. The process of claim 1 wherein the oxidizing gas is a mixture of $CO_2$, CO, $CH_4$, $H_2$ and $N_2$, having a $CO_2$/CO ratio of between 0.015:1 to 0.05:1, a $H_2/N_2$ ratio of between 20:1 and 3:1 and $CH_4/H_2$ ratio of between about 0.01:1 to 0.2:1.

4. The process of claim 3 wherein the oxidizing gas is a mixture of $CO_2$, CO, $H_2$, $CH_4$ and $N_2$ and the ratio of $CO_2$/CO is within the range of 0.03:1 to 0.04:1, the ratio of $CH_4/H_2$ is in the range of 0.04:1 to 0.08:1, and the ratio of $H_2N_2$ is about 6:1.

5. The method of claim 3 wherein the temperature in the reaction zone is maintained in the range of 1300° to 1700° C.

6. The method of claim 5 wherein said substrate is carbon.

7. The method of claim 6 wherein said gases are introduced in amounts sufficient to deposit a thin nonporous layer of silicon dioxide on said substrate.

8. A method of forming a glass article comprising:

contacting a silica containing material at temperatures in the range of about 1300° to 1700° C with a gaseous mixture containing hydrogen, methane and nitrogen whereby silicon monoxide is generated;

oxidizing said silicon monoxide with a carbon dioxide containing gas in the presence of a carbon substrate at a temperature in the range of 1300° to 1700° C whereby silicon dioxide glass is deposited on said carbon substrate and thereafter maintaining said deposited glass substrate at a temperature between about 800° and 1200° C in the presence of air whereby said carbon substrate is oxidized thereby providing a glass article.

9. The method of forming a microcapillary comprising: placing a carbon fiber mandrel in a furnace; introducing into the furnace a silicon monoxide containing gas; simultaneously introducing into the furnace an oxidizing gas containing $CO_2$ and CO, the composition of said gas being oxidizing with respect to silicon monoxide; maintaining the temperature of said silicon monoxide gas and said oxidizing gas in the range of about 1300° to 1700° C, whereby said silicon monoxide is oxidized to silicon dioxide and deposited on said carbon fiber in an amount sufficient to at least coat the exterior of the carbon fiber with a layer of silicon dioxide glass and thereafter maintaining said glass coated carbon fiber at a temperature between about 800° and 1200° C in the presence of air whereby said carbon fiber is oxidized thereby providing a thin walled microcapillary.

10. The method of claim 9 wherein an amount of silicon monoxide is oxidized sufficient to deposit at least 0.05 microns of silicon dioxide on said carbon fiber.

11. The method of claim 9 wherein said oxidizing gas is a mixture of $CO_2$, CO, $H_2$, $CH_4$ and $N_2$ having a $CO_2$/CO ratio of between 0.015:1 to 0.5:1, a $H_2/N_2$ ratio of between 20:1 and 3:1 and a $CH_4/H_2$ ratio of between about 0.01:1 to 0.2:1.

* * * * *